United States Patent
Zhou et al.

(10) Patent No.: US 11,211,676 B2
(45) Date of Patent: Dec. 28, 2021

(54) MULTI-RESONATOR FILTERS

(71) Applicant: COM DEV Ltd., Mississauga (CA)

(72) Inventors: Zhifu Zhou, Cambridge (CA); Ming Yu, Waterloo (CA)

(73) Assignee: COM DEV Ltd., Mississauga (CA)

(*) Notice: Subject to any disclaimer, the term of this patent is extended or adjusted under 35 U.S.C. 154(b) by 0 days.

(21) Appl. No.: 16/597,481

(22) Filed: Oct. 9, 2019

(65) Prior Publication Data

US 2021/0111704 A1 Apr. 15, 2021

(51) Int. Cl.
*H01P 1/20* (2006.01)
*H01P 11/00* (2006.01)
(Continued)

(52) U.S. Cl.
CPC .............. *H01P 1/20* (2013.01); *H01P 11/007* (2013.01); *H01P 7/04* (2013.01); *H01P 7/08* (2013.01);
(Continued)

(58) Field of Classification Search
CPC ...... H03H 9/6406; H03H 9/6433; H03H 9/46; H03H 9/54; H03H 9/58; H03H 9/60; H03H 9/605; H01P 7/04; H01P 7/08
See application file for complete search history.

(56) References Cited

U.S. PATENT DOCUMENTS 3,622,917 A    11/1971   Arleevskaya
4,477,785 A *  10/1984   Atia ..................... H01P 1/2084
                                                          333/202

(Continued)

FOREIGN PATENT DOCUMENTS

CN    107181032 A    9/2017
EP    1782496 A1    5/2007
(Continued)

OTHER PUBLICATIONS

Yu, "Power-Handling Capability for RF Filters", IEEE Microwave Magazine (2007), 8(5): 88-97.
(Continued)

*Primary Examiner* — Dean O Takaoka
*Assistant Examiner* — Alan Wong
(74) *Attorney, Agent, or Firm* — Bereskin & Parr LLP/S.E.N.C.R.L., s.r.l.; Isis E. Caulder; T. Cameron Gale

(57) ABSTRACT

A multi-resonator filter has a signal input terminal, a signal output terminal, and a plurality of resonator components. The plurality of resonator components include an input resonator component coupled to the signal input terminal, an output resonator component coupled to the signal output terminal, and at least one intermediate resonator component coupled between the input resonator component and the output resonator component. The input resonator component, output resonator component and the at least one intermediate resonator component are arranged in a sequence to define a signal path between the signal input terminal and the signal output terminal. The at least one intermediate resonator component includes at least one multiple resonator component, where each multiple resonator component includes a pair of individual resonators coupled in parallel where each individual resonator in a given pair of individual resonators has the same resonant frequency.

20 Claims, 8 Drawing Sheets

(51) Int. Cl.
*H01P 7/04* (2006.01)
*H01P 7/08* (2006.01)
*H03H 9/64* (2006.01)

(52) U.S. Cl.
CPC ......... *H03H 9/6406* (2013.01); *H03H 9/6433* (2013.01)

(56) References Cited

U.S. PATENT DOCUMENTS

| | | |
|---|---|---|
| 5,184,096 A | 2/1993 | Wakino et al. |
| 5,294,898 A | 3/1994 | Dworsky et al. |
| 5,559,483 A | 9/1996 | Kajihara et al. |
| 5,584,067 A | 12/1996 | Buer et al. |
| 5,812,036 A * | 9/1998 | Estrada ................ H01P 1/2053 333/202 |
| 6,518,854 B2 | 2/2003 | Kayano et al. |
| 6,927,652 B2 * | 8/2005 | Hidalgo Carpintero .................... H01P 1/2053 333/202 |
| 7,271,684 B2 * | 9/2007 | Nishihara ............ H03H 9/0095 333/133 |
| 7,317,365 B2 * | 1/2008 | Rosenberg ............. H01P 1/203 333/100 |
| 7,365,619 B2 | 4/2008 | Aigner et al. |
| 7,385,464 B2 | 6/2008 | Shibagaki et al. |
| 7,742,793 B2 * | 6/2010 | Ye ....................... H01P 1/20336 505/210 |
| 7,777,597 B2 | 8/2010 | Beaudin et al. |
| 7,894,867 B2 | 2/2011 | Matthaei et al. |
| 7,915,977 B2 * | 3/2011 | Rhodes ..................... H01P 1/20 333/202 |
| 8,330,372 B2 * | 12/2012 | Kang ....................... H01P 9/00 315/5.41 |
| 8,907,747 B2 | 12/2014 | Bernier et al. |
| 2004/0130411 A1 | 7/2004 | Beaudin et al. |

FOREIGN PATENT DOCUMENTS

| | | |
|---|---|---|
| KR | 2009036327 A | 4/2009 |
| WO | 95/28746 A2 | 10/1995 |

OTHER PUBLICATIONS

Extended European Search Report issued in EP Patent Application No. 20198827.6 dated Mar. 1, 2021 (10 pages).

* cited by examiner

MULTI-RESONATOR FILTERS

FIELD

This disclosure relates generally to signal filters, and more particularly to filters for electromagnetic signals with a plurality of resonators.

INTRODUCTION

The following is not an admission that anything discussed below is part of the prior art or part of the common general knowledge of a person skilled in the art.

U.S. Pat. No. 7,777,597 of Beaudin et al. purports to disclose a band reject filter that includes a first acoustic resonator and a second acoustic resonator, each of which has either shunt resonators adapted to resonate substantially at respective resonance frequencies defining a rejection frequency band or series resonators adapted to anti-resonate substantially at respective anti-resonance frequencies defining the rejection frequency band. These resonators are connected through a phase shifter which imparts an impedance phase shift of approximately 45° to 135°.

U.S. Pat. No. 6,518,854 of Kayano et al. purports to disclose a filter circuit that includes a first resonator and a second resonator each having a different resonance frequency. The first resonator is included in a first block, and the second resonator is included in a second block. The first block further includes a first delay unit connected to the first resonator. An input terminal divides an input signal to the first block and the second block. An output terminal combines signals passing through the first block and the second block and outputs the combined signal. The first delay unit converts a phase difference between the signals passing through the first block and the second block to reverse-phase or nearly reverse-phase.

U.S. Pat. No. 5,184,096 of Wakino et al. purports to disclose a parallel connection multi-stage band-pass filter including an input terminal and an output terminal for signals, a plurality of resonators respectively having resonator frequencies different from and close to one another which are electrically connected in parallel to each other between said input and output terminals.

SUMMARY

The following introduction is provided to introduce the reader to the more detailed discussion to follow. The introduction is not intended to limit or define any claimed or as yet unclaimed invention. One or more inventions may reside in any combination or sub-combination of the elements or process steps disclosed in any part of this document including its claims and figures.

Filters for electromagnetic signals can be constructed using an arrangement of resonators. The resonators can be coupled together in a sequence through which electromagnetic signals are passed. The configuration of each resonators, and their arrangement in the sequence, can define the filter response provided of the filter.

In resonator filters that operate at high power levels, individual filters can be subject to high levels of thermal loading. The resonators may also experience increased multipaction effects. Thermal loading and multipaction can damage, and possibly even destroy, the resonators. Increased levels of thermal loading and multipaction can thus increase the likelihood of the filter degrading and/or breaking down. Reducing the thermal load and multipaction effects on the resonators in a multi-resonator filter may increase the usable lifespan and effectiveness of a multi-resonator filer.

The thermal loading experienced by the individual resonators in a multi-resonator filter may vary. In embodiments described herein, critical, single resonators of a filter that experience high thermal loading (high power) can be identified and substituted with a multi-resonator arrangement such as a dual resonator arrangement. The multi-resonator arrangement can include two or more individual resonators that are connected in parallel and have the same resonant frequency. The parallel resonators can be positioned in the resonator arrangement of the electromagnetic filter in place of the previously identified single resonator. This may reduce the thermal loading on the resonant component and increase the multipaction margin of each resonator. This may provide improvements in usability and lifespan for electromagnetic signal filters, and in particular filters used in high power applications.

In accordance with an aspect of this disclosure, which may be used alone or in combination with any other aspect, a multi-resonator filter is provided. The multi-resonator filter can include a signal input terminal; a signal output terminal; and a plurality of resonator components. The plurality of resonator components can include an input resonator component coupled to the signal input terminal, an output resonator component coupled to the signal output terminal, and at least one intermediate resonator component coupled between the input resonator component and the output resonator component. The input resonator component, output resonator component and the at least one intermediate resonator component can be arranged in a sequence to define a signal path between the signal input terminal and the signal output terminal; the at least one intermediate resonator component can include at least one multiple resonator component, each multiple resonator component including a pair of individual resonators coupled in parallel where each individual resonator in a given pair of individual resonators has the same resonant frequency.

In some embodiments, the at least one intermediate resonator component can include a first intermediate resonator component, a second intermediate resonator component and a third intermediate resonator component coupled in sequence from the first intermediate resonator component to the second intermediate resonator component to the third intermediate resonator component; and the second intermediate resonator is one of the at least one multiple resonator components.

In some embodiments, the at least one intermediate resonator component can include a first intermediate resonator component and a second intermediate resonator component coupled in sequence from the first intermediate resonator component to the second intermediate resonator component; the first intermediate resonator can be one of the multiple resonator components; and the input resonator component can be cross-coupled with the second intermediate resonator component.

In some embodiments, the at least one intermediate resonator component can include a first intermediate resonator component and a second intermediate resonator component coupled in sequence, where each of the first intermediate resonator and the second intermediate resonator are multiple resonator components.

In some embodiments, a specific multiple resonator component in the at least one multiple resonator component can include at least one additional individual resonator coupled in parallel with both of the individual resonators in the pair of individual resonators, and each additional individual resonator has the same resonant frequency as the individual resonators in the pair of individual resonators.

In some embodiments, the signal input is operable to receive signals having a signal power peak of greater than 5 kW.

In some embodiments, the resonant frequency of each multiple resonator component is in a frequency range between 300 MHz and 300 GHz. In some embodiments, the frequency range is between 25 GHz and 40 GHz.

In some embodiments, the plurality of resonator components define a signal bandpass response for the multi-resonator filter.

In accordance with an aspect of this disclosure, which may be used alone or in combination with any other aspect, a method of manufacturing a multi-resonator filter having a multi-resonator bandpass response that corresponds to a series resonator bandpass response of an existing resonator filter having a plurality of individual resonators coupled in series between a signal input and a signal output is provided. The method includes identifying at least one of the individual resonators in the plurality of individual resonators as a potentially risky resonator when the at least one individual resonator satisfies a filter risk criteria; and providing a multi-resonator signal input terminal; providing a multi-resonator signal output terminal; coupling an input resonator component to the signal input terminal; coupling an output resonator component to the signal output terminal; and coupling at least one intermediate resonator component between the input resonator component and the output resonator component to define a signal path between the signal input terminal and the signal output terminal, the at least one intermediate resonator comprising a given intermediate resonator component corresponding to each of the individual resonators of the existing resonator filter; where the given intermediate resonator component corresponding to each potentially risky resonator comprises a multiple resonator component, each multiple resonator component including a pair of individual resonators coupled in parallel with each individual resonator in a given pair of individual resonators has the same resonant frequency.

In some embodiments, the at least one intermediate resonator component can include a first intermediate resonator component, a second intermediate resonator component and a third intermediate resonator component; the second intermediate resonator is one of the multiple resonator components; and coupling the at least one intermediate resonator component between the input resonator component and the output resonator component can include coupling the first intermediate resonator component, second intermediate resonator component, and third intermediate resonator component in sequence from the first intermediate resonator component to the second intermediate resonator component to the third intermediate resonator component.

In some embodiments, the at least one intermediate resonator component can include a first intermediate resonator component and a second intermediate resonator component coupled in sequence from the first intermediate resonator component to the second intermediate resonator component; the first intermediate resonator can be one of the multiple resonator components; and coupling the at least one intermediate resonator component between the input resonator component and the output resonator component can include cross-coupling the input resonator component with the second intermediate resonator.

In some embodiments, coupling the at least one intermediate resonator component between the input resonator component and the output resonator component includes coupling a first multiple resonator component and a second multiple resonator component coupled in sequence.

In some embodiments, one of the multiple resonator components includes at least one additional individual resonator coupled in parallel with both of the individual resonators in the pair of individual resonators, and each additional individual resonator has the same resonant frequency as the individual resonators in the pair of individual resonators.

In some embodiments, the method includes configuring the signal input terminal to receive signals having a signal power peak of greater than 5 kW.

In some embodiments, the method includes defining the resonant frequency of each multiple resonator component in a frequency range between 300 MHz and 300 GHz. In some embodiments, the frequency range is between 25 GHz and 40 GHz.

It will be appreciated by a person skilled in the art that an apparatus or method disclosed herein may embody any one or more of the features contained herein and that the features may be used in any particular combination or sub-combination. These and other aspects and features of various embodiments will be described in greater detail below.

BRIEF DESCRIPTION OF THE DRAWINGS

For a better understanding of the described embodiments and to show more clearly how they may be carried into effect, reference will now be made, by way of example, to the accompanying drawings in which.

Figure 1A:
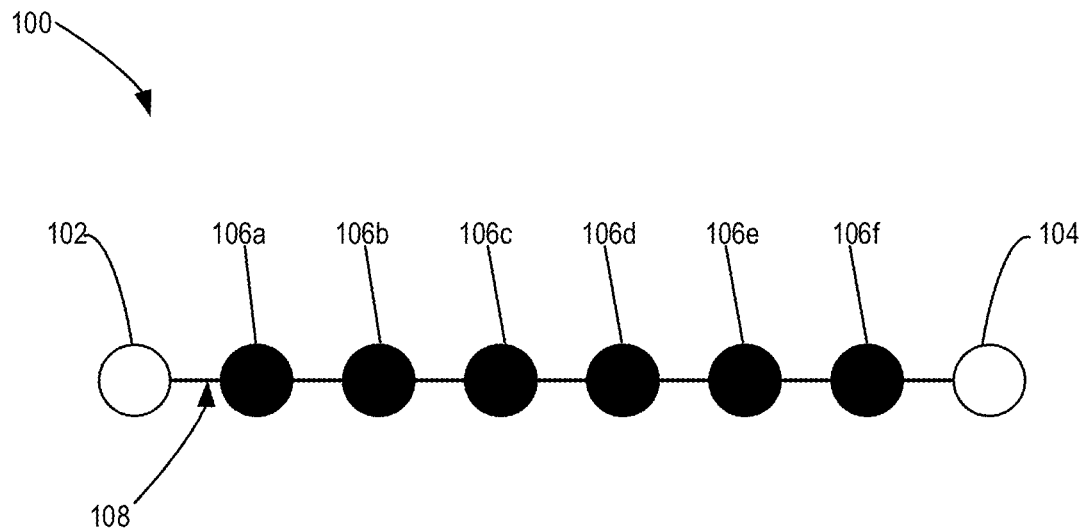
FIG. 1A is a schematic drawing of an example multi-resonator filter.

The drawings included herewith are for illustrating various examples of articles, methods, and apparatuses of the teaching of the present specification and are not intended to limit the scope of what is taught in any way.

DESCRIPTION OF EXAMPLE EMBODIMENTS

Various apparatuses, methods and compositions are described below to provide an example of an embodiment of each claimed invention. No embodiment described below limits any claimed invention and any claimed invention may cover apparatuses and methods that differ from those described below. The claimed inventions are not limited to apparatuses, methods and compositions having all of the features of any one apparatus, method or composition described below or to features common to multiple or all of the apparatuses, methods or compositions described below. It is possible that an apparatus, method or composition described below is not an embodiment of any claimed invention. Any invention disclosed in an apparatus, method or composition described below that is not claimed in this document may be the subject matter of another protective instrument, for example, a continuing patent application, and the applicant(s), inventor(s) and/or owner(s) do not intend to abandon, disclaim, or dedicate to the public any such invention by its disclosure in this document.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures, and components have not been described in detail so as not to obscure the example embodiments described herein. Also, the description is not to be considered as limiting the scope of the example embodiments described herein.

Electromagnetic filters can be used to control the frequency of signals that are passed between different communication components. In various communication systems, different services transmit signals in specific frequency bands. Bandpass filters can be used to permit signal components in specific frequency band(s) to be transmitted, while preventing signal components from being transmitted in other frequency bands.

Waveguide resonators can provide useful signal transmission attributes, such as low loss, high power handling and a wide spurious-free window. However, waveguide resonators used to provide a signal filter may degrade when subject to thermal loading and/or multipaction effects. In high power applications, higher levels of thermal loading and multipaction on individual resonators may significantly impact the reliability and lifespan of a waveguide filter. Reducing the impact of thermal loading and/or multipaction may extend the usable lifespan and reliability of resonator filters.

Embodiments described herein may provide multi-resonator filters that have reduced thermal loading and improved multipaction thresholds. The embodiments described herein may be configured as high-power waveguide resonator filters that include a sequence with a plurality of resonators. The resonators can be selected to define the filter response (e.g. the pass band) of the filter.

Resonator filters may typically be manufactured using a sequence of individual resonators. Embodiments described herein may replace one or more individual resonators within the sequence with a multiple resonator component that includes a plurality of parallel resonators. For example, individual resonators within the sequence that experience thermal loading above a thermal loading threshold (i.e. resonators that experience high power transmission) may be replaced with a multiple resonator component that includes a plurality of parallel resonators. This may reduce the thermal loading experienced by any individual resonator, which may in turn reduce the frequency of faults or failures at critical resonators.

In general, the multiple resonator components can include two or more individual resonators that are connected in parallel. Each individual resonator in the multiple resonator component can be configured with the same resonant frequency. The resonant frequency of the parallel resonators can be defined to be the same as the resonator frequency of the individual resonator being replaced. The power that previously flowed through the individual resonator can then be split between the plurality of parallel resonators, thereby reducing the power handled by each individual resonator. This may reduce thermal loading on each resonator of the parallel resonator and increase the multipaction margin of each resonator.

Referring to FIG. 1A, shown therein is an example multi-resonator filter 100. Multi-resonator filter 100 is an example of a 6th order or 6-pole Chebyshev filter.

The multi-resonator filter 100 includes a signal input 102, a signal output 104 and a plurality of resonators 106a-106f. In the example shown in FIG. 1A, the plurality of resonators 106a-106f are all connected in series in a sequence from the signal input 102 to the signal output 104.

In the example shown, multi-resonator filter 100 does not include cross-coupling between any of the resonators 106a-106f. Each of the resonators 106a-106f is directly coupled to the resonator(s) and/or signal input/output that are immediately upstream and downstream therefrom in the sequence.

Multi-resonator filter 100 may be configured as a bandpass filter. The resonance frequencies of the resonators 106a-106f can be selected to define a passband of the multi-resonator filter 100.

Figure 1B:
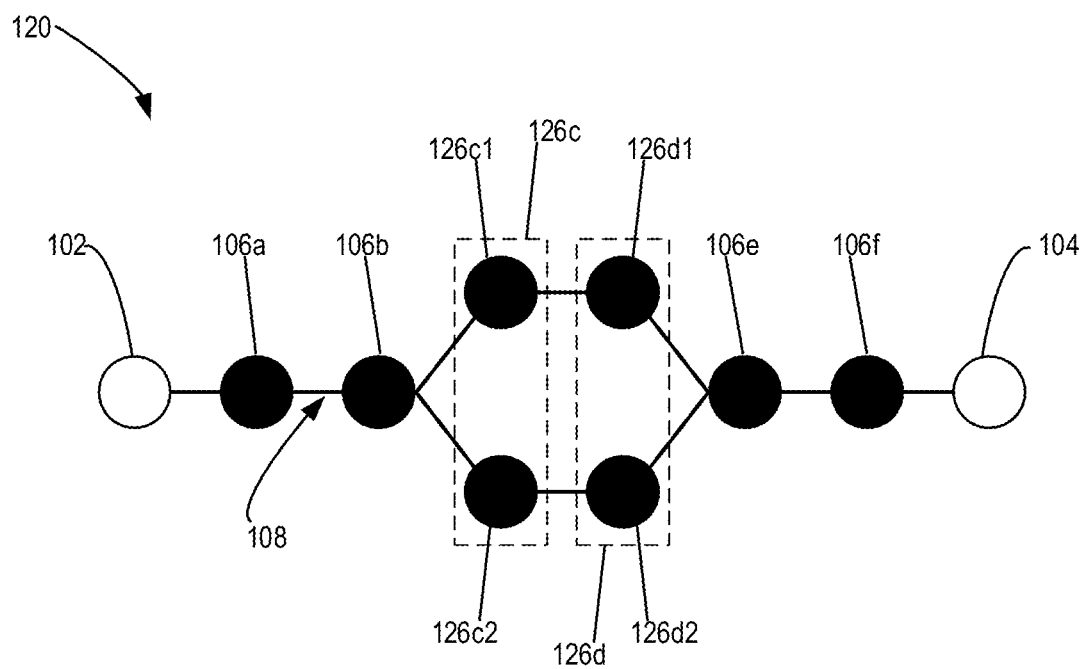
FIG. 1B is a schematic drawing of a multi-resonator filter that includes a multiple resonator component in accordance with an embodiment.

Referring now to FIG. 1B, shown therein is an example of a multi-resonator filter 120 that includes multiple resonator components. As with multi-resonator filter 100, multi-resonator filter 120 is an example of a 6th order or 6-pole Chebyshev filter. However, in multi-resonator filter 120 the resonators 106c and 106d have been replaced with multiple resonator components 126c and 126d respectively.

Multi-resonator filter 120 includes a signal input terminal 102 and a signal output terminal 104. A plurality of resonator components 106a, 106b, 126c, 126d, 106e and 106f can be coupled between the signal input terminal 102 and the signal output terminal 104.

The input terminal 102 and output terminal 104 can define interfacing waveguides. The interfacing waveguides may facilitate connection of the filter 120 to external signal transmission components and systems. The resonator components 106/126 can provide resonant waveguides that are configured to transmit specified frequencies of electromagnetic signals.

The plurality of resonator components include an input resonator component 106a coupled to the signal input terminal 102. In the example illustrated, the input resonator component 106a is an individual resonator.

The plurality of resonator components also include an output resonator component 106f coupled to the signal output terminal 104. In the example illustrated, the output resonator component 106f is an individual resonator.

Providing the input resonator component 106a and the output resonator component 106f using single resonators can simplify the design of filter 100. This may also simplify the filter manufacturing process.

The input resonator component 106a and the output resonator component 106f typically do not experience high power dissipation or a high voltage ratio. As a result, there may be no need to use a multiple resonator component to provide the input resonator component 106a and/or the output resonator component 106f.

In embodiments described herein, the plurality of resonator components can include at least one intermediate resonator component. In multi-resonator filter 120, the plurality of resonator components include a plurality of intermediate resonators between the input resonator component 106a and the output resonator component 106f. In the example shown, multi-resonator filter 120 includes intermediate resonator components 106b, 126c, 126d, and 106e.

The plurality of resonator components are arranged in a sequence between the signal input terminal 102 and the signal output terminal 104. The sequence of resonator components defines a signal path between the signal input terminal 102 and the signal output terminal 104. A signal entering the signal input terminal 102 can travel to the signal output terminal 104 along the signal path defined by the sequence of resonator components.

In embodiments described herein, the intermediate resonator components can include at least one multiple resonator component. The multiple resonator components may be provided at positions in the resonator sequence where high power levels will be experienced.

One or more of the intermediate resonator components 106b, 106c, 106d, and 106e in filter 100 may experience high power dissipation and/or high voltage ratios. Accordingly, in filter 120 the resonator components 106c and 106d can be replaced with multi-resonator components 126c and 126d, respectively, to increase the power handling capacity of those resonator components.

Providing the multi-resonator components 126c and 126d between the input resonator component 106a and the output resonator component 106f can help to increase the average and peak-power handling capabilities of filter 120. This may also increase the multipaction thread of filter 120.

By increasing the power handling capacity and/or multipaction thread of filter 120, a single filter 120 may be capable of handling power that would otherwise require two or three separate filters. This may allow the overall weight and size of a filtering system to be reduced. Furthermore, system production costs can be reduced.

Additionally, the increased power handling of filter 120 may reduce the likelihood of filter 120 being damaged or destroyed by high power or peak power.

In the example of multi-resonator filter 120, the intermediate resonator components include a plurality of multiple resonator components 126c and 126d. Each multiple resonator component 126c and 126d can include a pair of individual resonators coupled in parallel. Each individual resonator in a given pair of individual resonators can have the same resonant frequency.

For instance, multiple resonator component 126c includes a first individual resonator 126c1 and a second individual resonator 126c2. The first individual resonator 126c1 and second individual resonator 126c2 are coupled in parallel in the sequence of resonator components between the signal input terminal 102 and the signal output terminal 104. The resonant frequencies of the first individual resonator 126c1 and second individual resonator 126c2 can be defined to be the same. In embodiments where multi-resonator filter 120 is configured to provide the same filtering operation as filter 100, the resonant frequencies of the first individual resonator 126c1 and second individual resonator 126c2 can be defined to be the same as the resonant frequency of the individual resonator 106c that was replaced.

Multiple resonator component 126d also includes a first individual resonator 126d1 and a second individual resonator 126d2. The first individual resonator 126d1 and second individual resonator 126d2 are also coupled in parallel in the sequence of resonator components between the signal input terminal 102 and the signal output terminal 104. The resonant frequencies of the first individual resonator 126d1 and second individual resonator 126d2 can be defined to be the same. In embodiments where multi-resonator filter 120 is configured to provide the same filtering operation as filter 100, the resonant frequencies of the first individual resonator 126d1 and second individual resonator 126d2 can be defined to be the same as the resonant frequency of individual resonator 106d that was replaced.

In some cases, such as FIG. 4 described herein below, the multiple resonator components may include additional individual resonators in parallel. These additional resonators can also have the same resonant frequency.

The use of multiple resonator components 126c and 126d in multi-resonator filter 120 can define a branching signal path between the signal input terminal 102 and the signal output terminal 104. The signal path may include a first signal path branch that includes resonators 106b-126c1-126d1-106e and a second signal path branch that includes resonators 106b-126c2-126d2-106e.

Signals entering the plurality of resonator components from the signal input terminal 102 via input resonator component 106a can split between the signal path branches defined by the parallel resonators 126c1 and 126c2 in multiple resonator component 126c. As a result, in embodiments where multi-resonator filter 120 is configured to provide the same filtering operation as filter 100, the power transferred through the resonators 126c1 and 126c2 may be reduced by half as compared to the power that was transferred through resonator 106c. Similarly, the power transferred through the resonators 126d1 and 126d2 may be reduced by half as compared to the power that was transferred through resonator 106d.

The individual resonators within the multiple resonator components 126c and 126d can be defined to provide balanced signal transmission through the signal path branches defined by the parallel resonators. Providing a balanced plurality of resonators within each multiple resonator component 126c and 126d can help maximize the filter's high power handling capabilities.

The coupling between the resonators in filter 120 may also be adjusted to account for the use of multiple parallel resonators. For instance, the coupling coefficients between the individual resonator 106b and the multiple resonators 126c1 and 126c2 may be modified as compared to the coupling coefficient between resonators 106b and 106c in multi-resonator filter 100.

The coupling coefficient $M_{sm}$ between an individual resonator component (e.g. resonator 106b) and an individual resonator (e.g. 126c1 or 126c2) in the multiple resonator component (e.g. resonator 126c) may be determined based on the coupling coefficient $M_{ss}$ that was used between the individual resonator component (e.g. resonator 106b) and the individual resonator component (e.g. resonator 106c) that was replaced by the multiple resonator component (e.g. resonator 126c) as:

$$M_{sm} = \frac{M_{ss}}{\sqrt{n}}$$

where n is the number of individual resonators in parallel in the multiple resonator component, which in this case would be two.

As shown in multi-resonator filter 120, the intermediate resonator components can include a plurality of intermediate resonators 126c and 126d that are provided as multiple resonator components. In some cases, as shown in FIG. 1B, there may be two or more multiple resonator components directly coupled in the sequence from the signal input terminal 102 to the signal output terminal 104.

The coupling coefficients between multiple resonator components that are directly connected in the sequence may be determined based on the coupling coefficients of the individual resonators replaced thereby. Where two individual resonators are replaced by two multiple resonator components having the same number of individual resonators in parallel, the coupling coefficient between the individual resonators may remain the same.

For example, the coupling coefficient between resonators 126c1 and 126d1 can be the same as the coupling coefficient between resonators 106c and 106d. Similarly, the coupling coefficient between resonators 126c2 and 126d2 can be the same as the coupling coefficient between resonators 106c and 106d. Nonetheless, the power experienced by the individual resonators 126d1 and 126d2 can be reduced as compared to resonator 106d, since the signal has already split into two separate branching paths.

In embodiments described herein, the resonators 106 and 126 in filter 120 may be directly coupled to one another in the sequence. The multi-resonator filters may not require additional coupling components, such as phase shifters or delay units to connect the sequence of the resonators that define the multi-resonator filter. Accordingly, in embodiments described herein the sequence of resonators may omit additional coupling components such as phase shifters and/or delay units.

In some embodiments, the individual resonators (e.g. individual resonators 126c1 and 126c2 in multiple resonator component 126c) used in multiple resonator components may be the same as the individual resonators (e.g. resonator 106c) that were replaced by the multiple resonator component. Alternatively, the individual resonator construction may be different. Typically, however, the resonant frequencies can remain the same.

The multi-resonator filters described herein, such as multi-resonator filter 120, can be configured to couple electromagnetic wave signals. In particular, signals with wavelengths in the microwave spectrum may be coupled using embodiments of the filters described herein. In some cases, the resonators 106 and 126 in multi-resonator filter 120 can all be configured with resonant frequencies in a frequency range between about 300 MHz and 300 GHz.

In some cases, embodiments of the multi-resonator filters may be configured to operate with signals in the $K_a$ band of the microwave spectrum. For instance, the resonators 106 and 126 in multi-resonator filter 120 can all be configured with resonant frequencies in a frequency range between about 25 GHz and 40 GHz.

The filters described herein may be configured to provide filter operations for high-power microwave application. For instance, the signal input terminal can be configured to receive signals having a signal power peak of 5 kW or greater. To facilitate high power operations, the multiple resonator components (e.g. 126c and 126d) may increase the power handling capabilities of the multi-resonator filter 120 and reduce thermal loading on any single resonator.

In some embodiments described herein, the resonant frequencies of the resonators 106 and 126 can be selected to define the filter operation of the multi-resonator filter. For example, the multi-resonator filters can be configured to define a passband filter. The plurality of resonator components in the multi-resonator filter can be configured to define a signal bandpass response for the multi-resonator filter. The resonance frequencies of the resonators can be selected to define the passband(s) of the bandpass filter.

Figure 2A:
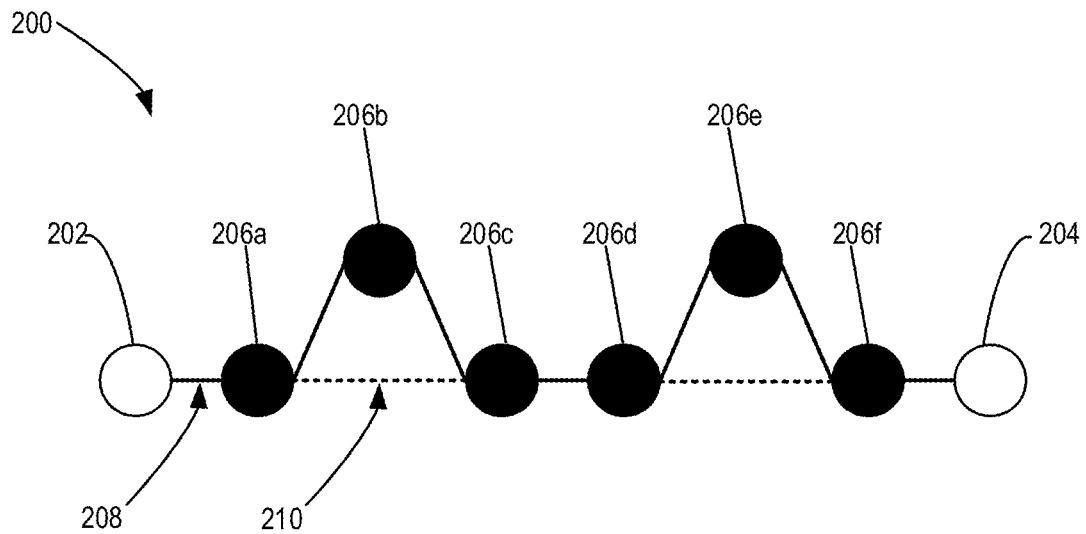
FIG. 2A is a schematic drawing of another example multi-resonator filter.

Referring now to FIG. 2A, shown therein is another example of a multi-resonator filter 200. Multi-resonator filter 200 is another example of a multi-resonator filter configured using only individual resonators 206.

In multi-resonator filter 200, a plurality of individual resonators 206a-206f are directly coupled in sequence between a signal input terminal 202 and a signal output terminal 204 to provide a 6th order or 6-pole filter. Filter 200 includes direct couplings 208 (shown throughout the figures as solid coupling lines 108, 208, 308, 408 between components) upstream and downstream from each of the individual resonators 206a-206f. Additionally, the filter 200 also includes cross-couplings 210 (shown throughout the figures as dashed lines between components) between resonators 206a and 206c as well as between resonators 206d and 206f.

Figure 2B:
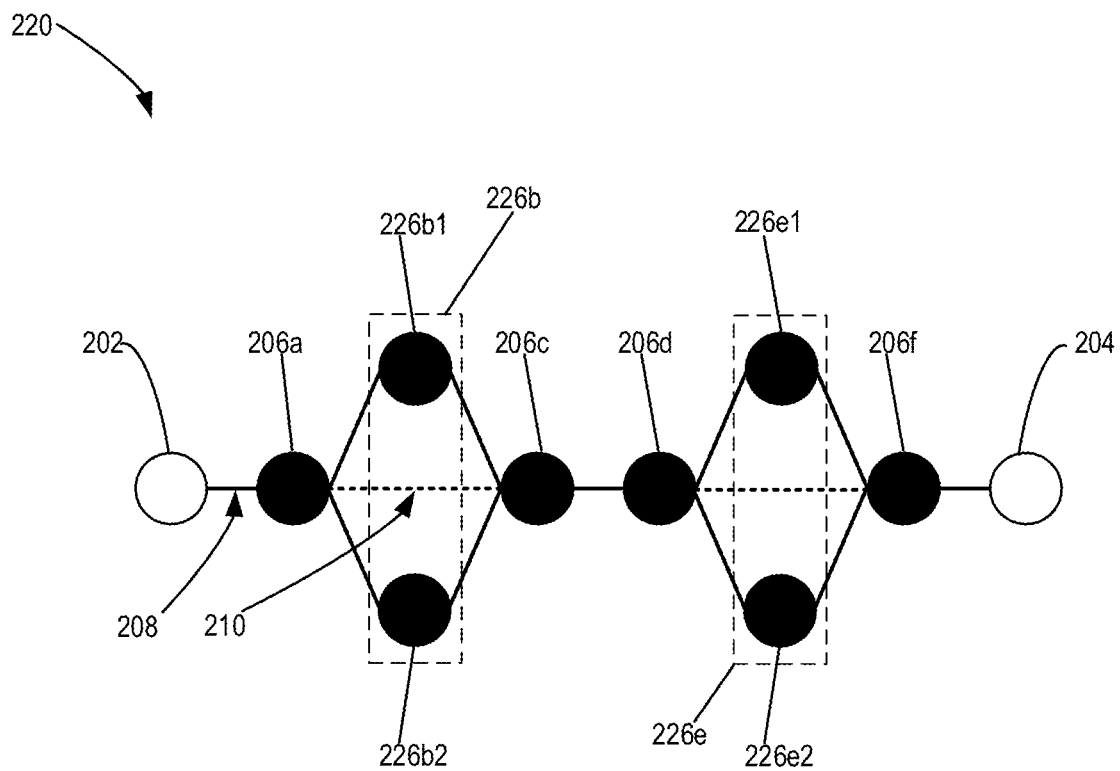
FIG. 2B is a schematic drawing of another multi-resonator filter that includes a multiple resonator component in accordance with an embodiment.

Referring now to FIG. 2B, shown therein is another example of a multi-resonator filter 220. As with multi-resonator filter 200, multi-resonator filter 220 is configured as a 6th order filter that includes cross-couplings between resonators 206a and 206c as well as between resonators 206d and 206f. However, in multi-resonator filter 220, the individual resonators 206b and 206e have been replaced by multiple resonator components 226b and 226e.

Each multiple resonator component 226b and 226e can include a plurality of individual resonators in parallel, i.e. 226b1 and 226b2, and 226e1 and 226e2 respectively. The individual resonators in parallel within a given multiple resonator component can each have the same resonator frequency.

As shown in multi-resonator filter 220, the resonator components between the signal input terminal and signal output terminal 204 can include a plurality of intermediate resonator components. The plurality of resonator components may include a first resonator component 206a (also referred to as an input resonator component 206a), a first intermediate resonator component 226b and a second intermediate resonator component 206c directly coupled in a sequence from the first resonator component 206a to the first intermediate resonator component 226b to the second intermediate resonator component 206c. The plurality of resonator components may also include a third intermediate resonator component 206d, a fourth intermediate resonator component 226e and a sixth resonator component 206f (also referred to as an output resonator component 206f) directly coupled in a sequence from the third intermediate resonator component 206d to the fourth intermediate resonator component 226e to the sixth resonator component 206f.

The first intermediate resonator 226b may be a multiple resonator component that includes a plurality of individual resonators 226b1 and 226b2 in parallel. The multiple resonator component 226b can be directly coupled to an upstream individual resonator component and a downstream individual resonator component.

Additionally, as shown in FIG. 2B, the first resonator component 206a can be cross-coupled with the second intermediate resonator 206c. The cross-coupling between the resonator component 206a and resonator component 206c can be unchanged as compared with multi-resonator filter 200.

Figure 3A:
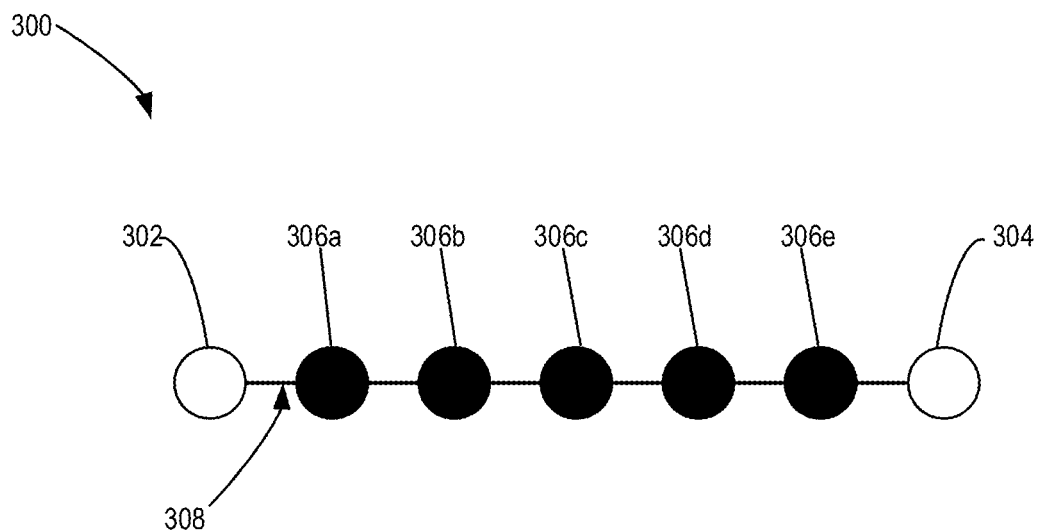
FIG. 3A is a schematic drawing of another example multi-resonator filter.

Referring now to FIG. 3A, shown therein is an example of a multi-resonator filter 300. Multi-resonator filter 300 is an example of a five-resonator filter that forms a 5th order or 5-pole filter.

Multi-resonator filter 300 includes a signal input terminal 302, a signal output terminal 304 and a plurality of resonator components 306a-306e coupled in sequence from the signal input terminal 302 to the signal output terminal 304. The input terminal 302 and output terminal 304 can define interfacing waveguides for the filter 300. Resonators 306 can provide resonant waveguides.

In implementations where filter 300 receives high-power signals (e.g. signals greater than a few, e.g. 2-3, kW peak) multipaction and thermal management may be significant limiting factors in the operation of filter 300. For instance, the resonator 300b may be at high risk for failure due to multipaction or thermal loading.

In embodiments of filter 300 configured to operate within the $K_a$ band, the dimensions of the filter 300 may be quite small. For instance, an example implementation WR-51 rectangular iris waveguides may be used that have a cross-sectional region of about 0.51 in×0.255 in. In this example, the filter 300 may be configured to operate at a frequency of 17.5 GHz with a peak power of 5 kW. The filter 300 may then have a voltage application factor of 7 beginning from resonator 300b. Accordingly, the filter 300 may have a power handling of −1.3 dB margin to the peak power requirement of 5 kW.

Figure 3B:
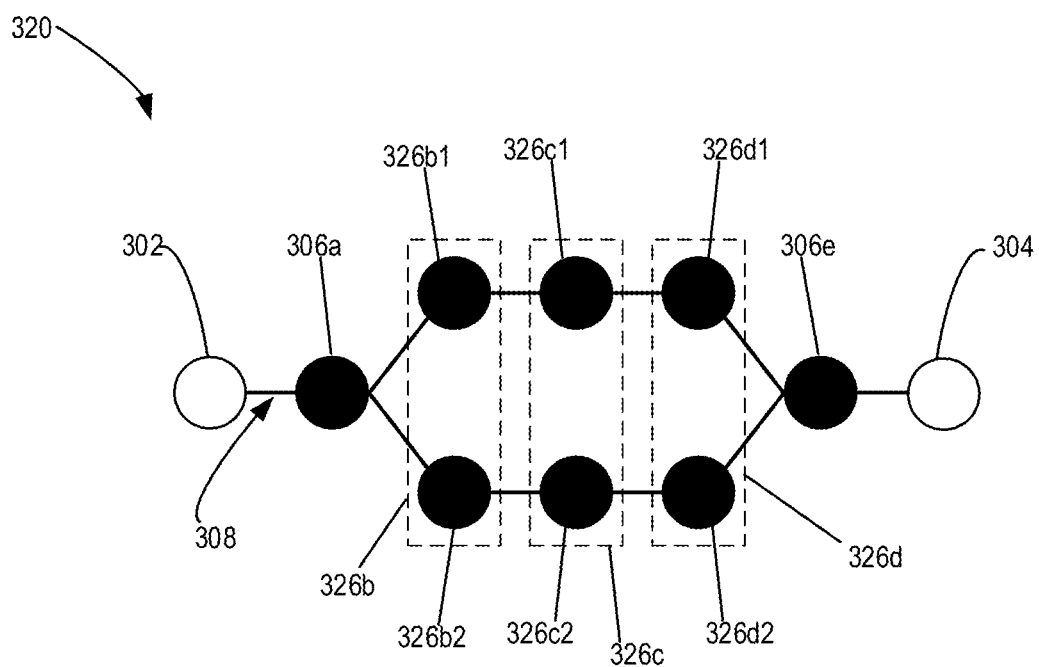
FIG. 3B is a schematic drawing of another multi-resonator filter that includes a multiple resonator component in accordance with an embodiment.

In accordance with embodiments described herein, the individual resonators 306b-306d can be replaced with dual resonators 326b-326d. Referring now to FIG. 3B, shown therein is an example multi-resonator filter 320 that includes multiple resonator components 326b-326d in place of the single resonators 306b-306d.

In filter 320, each individual resonator in a given multiple resonator component 326 may be required to handle only half the peak power of the filter 320 (i.e. 2.5 kW). That is, each of the individual resonators 326b1, 326b2, 326c1, 326c2, 326d1, and 326d2 may be required to handle only half of the power that would previously have been handled by the individual resonators 306b, 306c, and 306d they replaced respectively. Accordingly, the peak power handling of the filter 320 may have a power-handling margin of 1.7 dB.

For the potentially risky resonators (e.g. thermally risky and/or peak power risk resonators) in filter 300, the corresponding resonators used in the dual resonator components of filter 320 will have an improved thermal margin since the thermal path will be doubled. Additionally, the dissipation density of those individual resonators will be halved. For example, the individual resonators (in the multiple resonator components) in filter 320 may be required to handle 50% of the power and 70.7% of the voltage that was handled by the individual resonators in filter 300.

As explained above, the coupling coefficients between the resonators in filter 320 may be determined based on the coupling coefficients between resonators in filter 300. Table 1 and Table 2 below illustrate examples of non-zero coupling coefficients between resonators in example implementations of filter 300 and filter 320 respectively.

TABLE 1

Example Coupling Coefficients of Filter 300

| Upstream Resonator | Downstream Resonator | Coupling Coefficient |
|---|---|---|
| 306a | 306b | 0.97378 |
| 306b | 306c | 0.68248 |
| 306c | 306d | 0.68248 |
| 306d | 306e | 0.97378 |

TABLE 2

Example Coupling Coefficients of Filter 320

| Upstream Resonator | Downstream Resonator | Coupling Coefficient |
|---|---|---|
| 306a | 326b1 | 0.688566 |
| 306a | 326b2 | 0.688566 |
| 326b1 | 326c1 | 0.68248 |
| 326b2 | 326c2 | 0.68248 |
| 326c1 | 326d1 | 0.68248 |
| 326c2 | 326d2 | 0.68248 |
| 326d1 | 306e | 0.688566 |
| 326d2 | 306e | 0.688566 |

As shown in Tables 1 and 2 above, the coupling coefficient between resonators 306a and 306b were scaled by a factor of 0.707 (i.e. $\sqrt{2}$) to obtain the coupling coefficients between 306a and both 326b1 and 326b2. Similarly, the coupling coefficient between resonators 306d and 306e, in filter 300 were scaled by a factor of 0.707 (i.e. $\sqrt{2}$) to obtain the coupling coefficients between both 326d1 and 326d2 and 306e. However, the coupling coefficients between 306b and 306c as well as between 306c and 306d in filter 300 remain unchanged for the couplings between the individual resonators of multiple resonator components 326b and 326c as well as between multiple resonators 326c and 326d.

The scaling factor used to determine the coupling coefficients for a multi-resonator component using multiple resonator components can be varied based on the number of parallel branches in a given filter. As the power in filter 320 is split between two branches of the resonator sequence (i.e. a first branch with 326b1-326c1-326d1 and a second branch with 326b2-326c2-326d2), the voltage handled by each branch is reduced by the square root of two. In other cases, the power may be further divided, for example into three or more separate branches.

Figure 4:
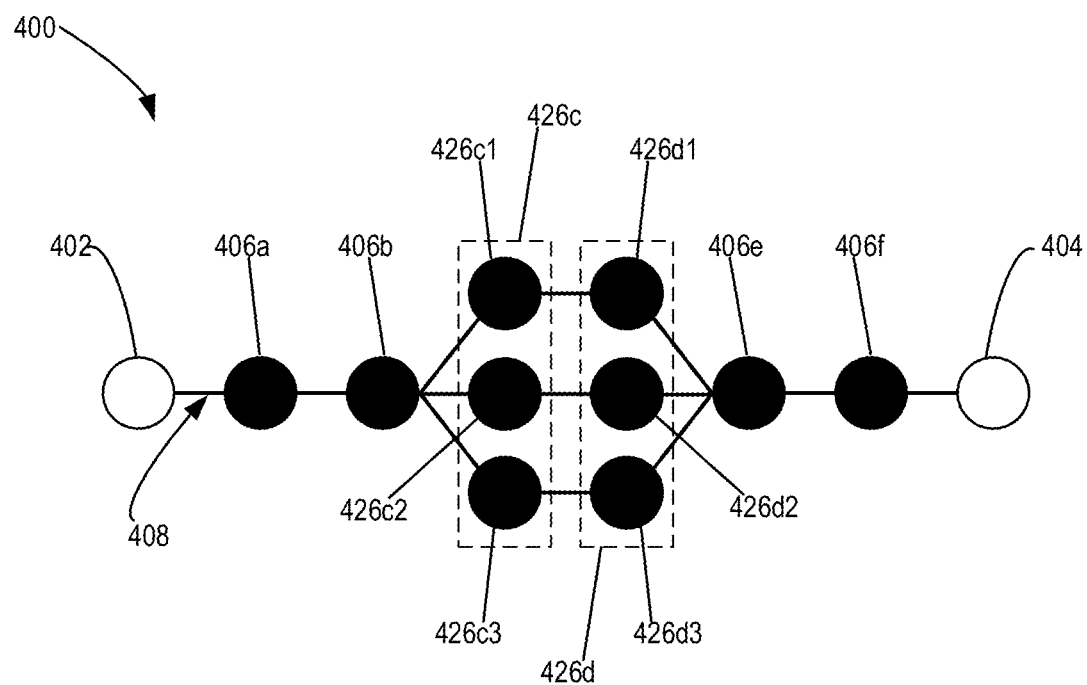
FIG. 4 is a schematic drawing of another multi-resonator filter that includes a multiple resonator component in accordance with an embodiment.

Referring now to FIG. 4, shown therein is an example of a multi-resonator filter 400. Filter 400 is an example of a multi-resonator filter that includes multiple resonator components 426c and 426d.

The filter 400 includes a signal input terminal 402 and a signal output terminal 404. A plurality of resonator components 406a, 406b, 426c, 426d, 406e, and 406f are coupled in sequence between the signal input terminal 402 and the signal output terminal 404. In filter 400, the multiple resonator components 426c and 426d include more than two individual resonators in parallel.

Multiple resonator component 426c includes three individual resonators 426c1, 426c2, and 426c3 in parallel. Each of the individual resonators 426c1, 426c2, and 426c3 has the same resonant frequency. The individual resonators 426c1, 426c2, and 426c3 are each directly coupled to the same upstream resonators 406b.

Multiple resonator component 426d includes three individual resonators 426d1, 426d2, and 426d3 in parallel. Each of the individual resonators 426d1, 426d2, and 426d3 has the same resonant frequency. The individual resonators 426d1, 426d2, and 426d3 are each directly coupled to the same downstream resonators 406e. The individual resonators 426d1, 426d2, and 426d3 are also directly coupled to corresponding individual resonators 426c1, 426c2, and 426c3 in multiple resonator component 426c.

As shown in filter 400, the multi-resonator filters in embodiments described herein can include three or more resonators in parallel. The parallel resonators can be used to increase power handling capabilities of resonator filters, particularly for individual resonators where power handling is of concern.

Embodiments of the multi-resonator filters described herein may be configured to correspond to existing resonator filters configured using a plurality of individual resonators coupled in series between a signal input and a signal output. The multi-resonator filters of embodiments described herein may be constructed or manufactured to provide a multi-resonator bandpass response that corresponds to the bandpass response of the existing resonator filter.

Figure 5:
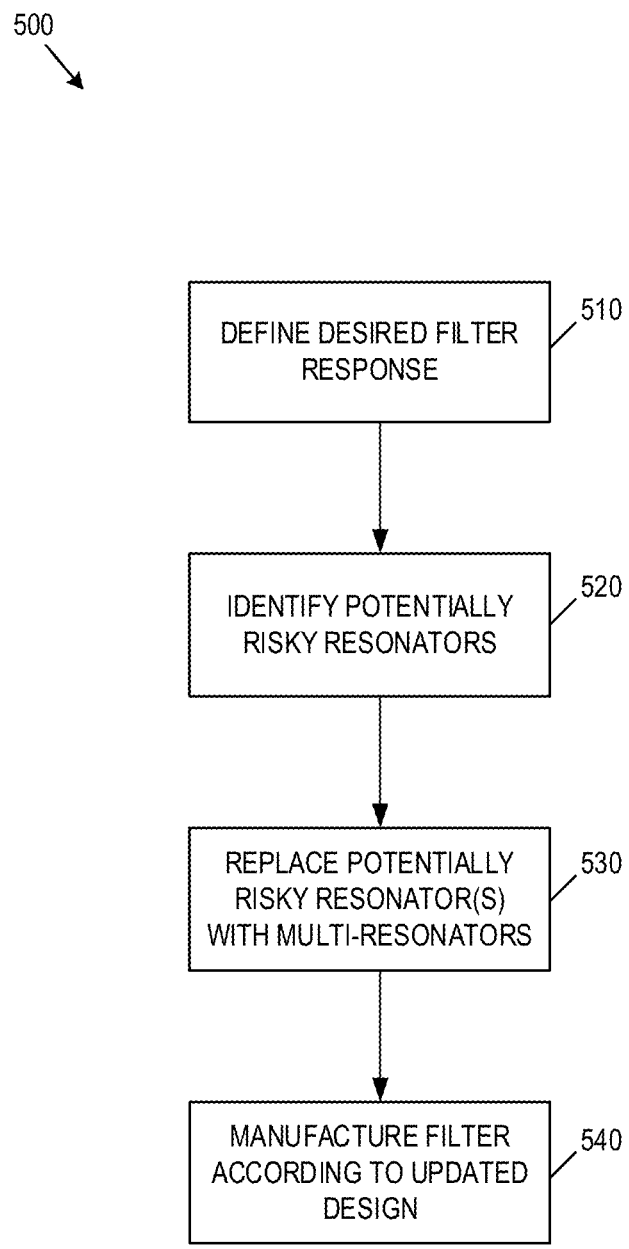
FIG. 5 is a flowchart illustrating an example process for designing a multi-resonator filter in accordance with an embodiment.

Referring now to FIG. 5, shown therein is an example process 500 for designing a multi-resonator filter is illustrated. Process 500 is an example process that may be implemented using filter design tools, such as software-based filter design applications. In the description that follows, process 500 will be described in the context of a filter providing a 6-pole Chebyshev band pass filter response similar to filters 100 and 120 described herein above.

At 510, a desired filter response can be defined. The desired filter response can be defined by specifying desired filter characteristics. Examples of desired filter characteristics can include filter type (e.g. high-pass, low-pass, band-pass etc.), bandwidth, frequency range and/or center frequency, filter quality, filter technology (e.g. waveguide, coaxial or strip-line resonator), and so on. The filter characteristics can be used to determine an initial filter response.

For example, desired filter characteristics can be input to a filter design application. The filter design application may then determine the initial filter response.

Figure 6:
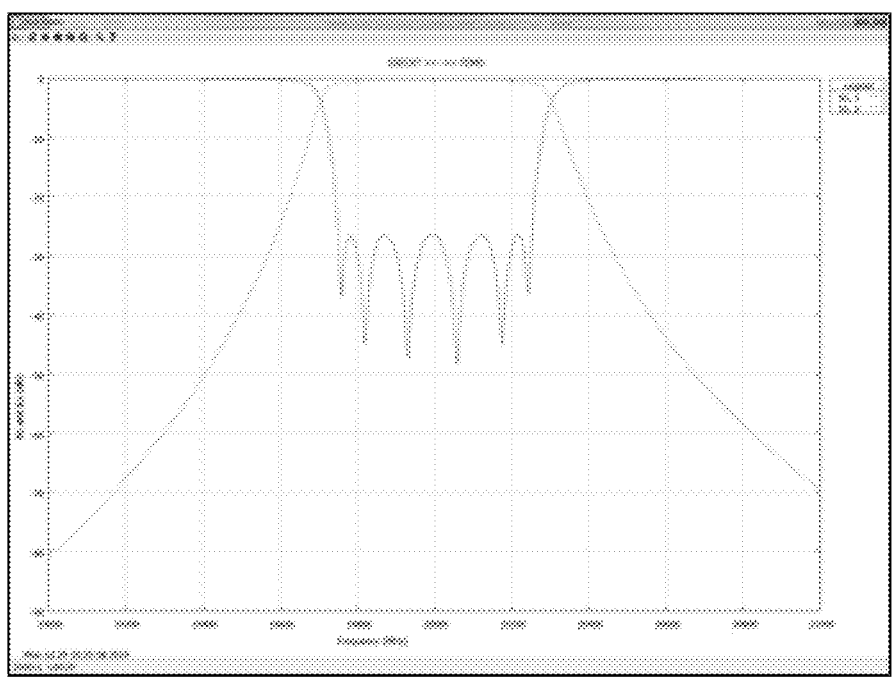
FIG. 6 is an example plot of an initial filter response.

FIG. 6 illustrates an example plot 600 of an initial filter response that may be generated by a filter design application. The filter response illustrated by plot 600 corresponds to an example 6-pole Chebyshev band pass filter response such as may be provided by filters 100 and 120. The plot 600 illustrates an idealized response of an example filter with a center frequency at 20 GHz and a bandwidth of 500 MHz.

At 520, at least one of the individual resonators in the plurality of individual resonators in the existing resonator filter may be identified as a potentially risky resonator. The potentially risky resonators may be identified using one or more filter risk criteria.

In some cases, potentially risky resonators may be identified using a thermal risk criteria. The thermal risk criteria may be determined based on the power handling capability of each resonator.

The example 6-pole Chebyshev band pass filter response may initially be designed using a sequence of six single resonators, similar to resonators 106a-106f in filter 100. Each resonator may be evaluated to determine whether that resonator is a potentially risky resonator.

Figure 7:
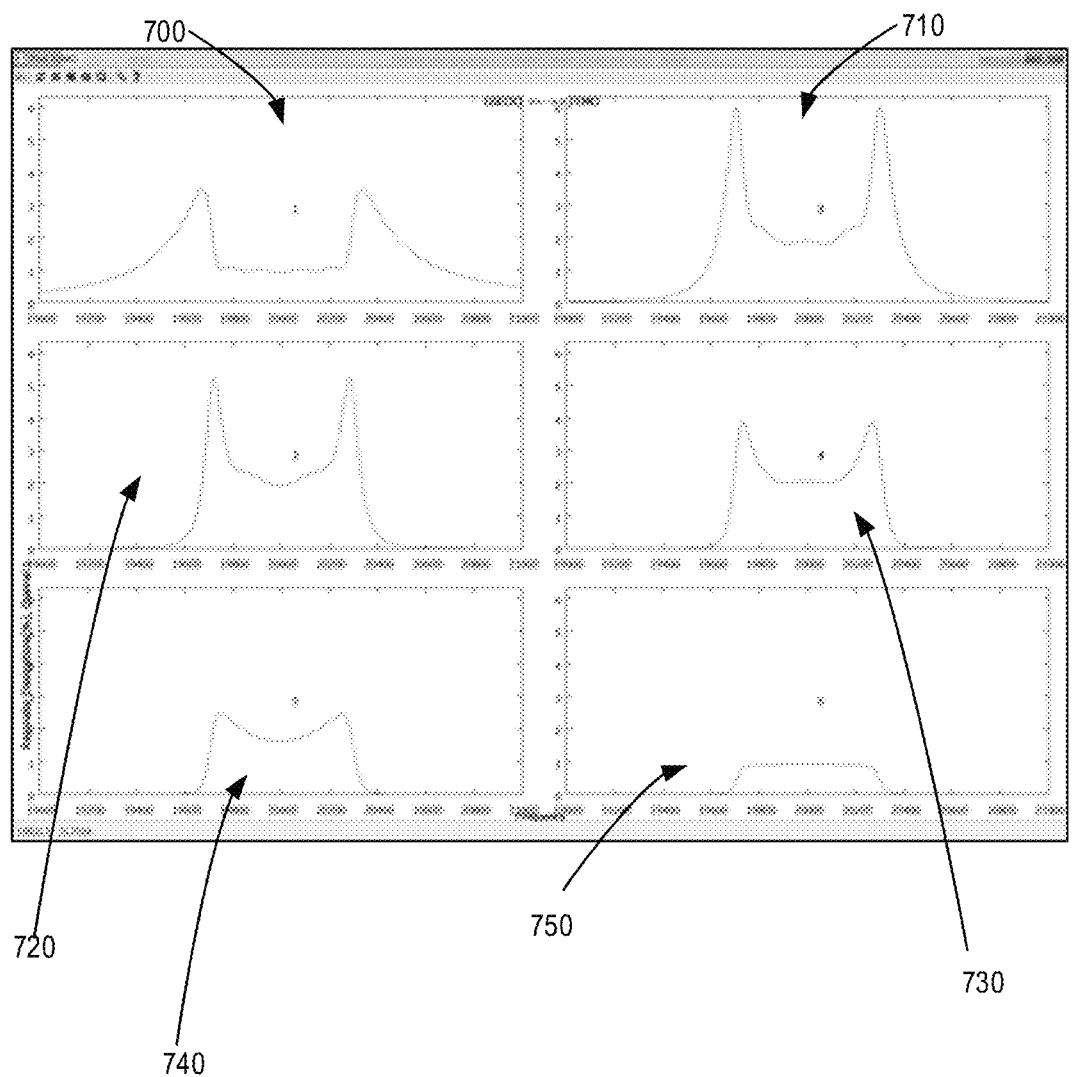
FIG. 7 is an example plot of power dissipation distribution for resonators in an example filter.

FIG. 7 illustrates example plots of power dissipation distribution for each individual resonator in the example 6-pole Chebyshev band pass filter. The plots shown in FIG. 7 illustrate a normalized power dissipation distribution with power dissipation normalized at 1 W for the input terminal. Each plot shows frequency on the x-axis and power dissipation percentage on the y-axis.

Plot 700 illustrates an example of the power dissipation distribution for a first resonator (e.g. resonator 106a). Plot 710 illustrates an example of the power dissipation distribution for a second resonator (e.g. resonator 106b). Plot 720 illustrates an example of the power dissipation distribution for a third resonator (e.g. resonator 106c). Plot 730 illustrates an example of the power dissipation distribution for a fourth resonator (e.g. resonator 106d). Plot 740 illustrates an example of the power dissipation distribution for a fifth resonator (e.g. resonator 106e). Plot 750 illustrates an example of the power dissipation distribution for a sixth resonator (e.g. resonator 106f).

As shown by plots 710, 720, 730 and 740, the second, third, fourth and fifth resonators have much higher power dissipation percentages. Accordingly, the second, third, fourth and fifth resonators may be identified as potentially risk resonators. The resonators may be identified as potentially risky resonators as the power dissipation percentage may be greater than a thermal risk threshold.

In some cases, potentially risky resonators may be identified using a peak power risk criteria. The peak power risk criteria may be determined based on the power voltage ratio of each resonator.

Figure 8:
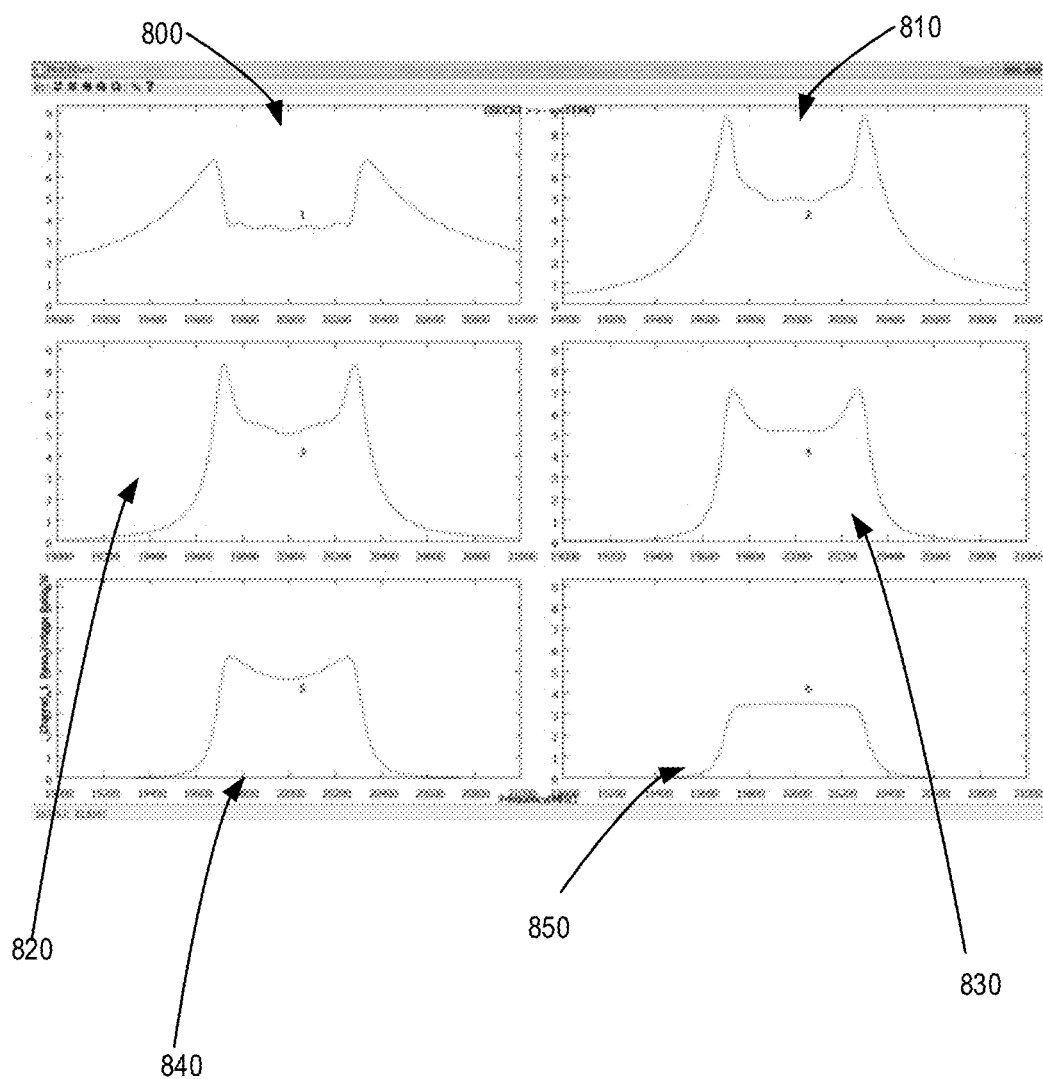
FIG. 8 is an example plot of power-voltage ratio distribution for resonators in an example filter.

FIG. 8 illustrates example plots of power voltage ratio distribution for each individual resonator in the example 6-pole Chebyshev band pass filter. The plots shown in FIG. 8 illustrate a normalized power voltage ratio distribution with the voltage ratio is normalized at 1 W for the input terminal. Each plot shows frequency on the x-axis and power voltage ratio per watt on the y-axis.

Plot 800 illustrates an example of the power voltage ratio distribution for a first resonator (e.g. resonator 106a). Plot 810 illustrates an example of the power voltage ratio distribution for a second resonator (e.g. resonator 106b). Plot 820 illustrates an example of the power voltage ratio distribution for a third resonator (e.g. resonator 106c). Plot 830 illustrates an example of the power voltage ratio distribution for a fourth resonator (e.g. resonator 106d). Plot 840 illustrates an example of the power voltage ratio distribution for a fifth resonator (e.g. resonator 106e). Plot 850 illustrates an example of the power voltage ratio distribution for a sixth resonator (e.g. resonator 106f).

As shown by plots 810, 820, 830 and 840, the second, third, fourth and fifth resonators have much higher power voltage ratios. Accordingly, the second, third, fourth and fifth resonators may be identified as potentially risk resonators. The resonators may be identified as potentially risky resonators as the power voltage ratios may be greater than a peak-power risk threshold.

Table 3 below provides a summary of the power dissipation percentage and voltage ratio per watt for the resonators 106a-106f in the example 6-pole Chebyshev band pass filter implementation. Table 3 corresponds to the power dissipation percentage and voltage ratio per watt distributions illustrated in FIGS. 7 and 8.

TABLE 3

Summary of Power Dissipation Percentage and of Voltage Ratio Comparison

| | Item | | | |
|---|---|---|---|---|
| | Power Dissipation (%) | | Voltage Ratio per W | |
| Resonator | Center Frequency | Band Edge | Center Frequency | Band Edge |
| 106a | 1 | 3.7 | 3.5 | 7 |
| 106b | 2.3 | 6 | 6 | 9 |
| 106c | 2 | 5.5 | 5.5 | 8.5 |
| 106d | 2.5 | 4.2 | 5.5 | 7.5 |
| 106e | 2 | 3.5 | 5 | 6 |
| 106f | 1 | 1 | 3.5 | 3.4 |

At 530, at least one of the potentially risky resonators identified at 520 can be replaced with a multi-resonator component. For example, as shown in FIG. 1B, resonators 106c and 106d can be replaced by multi-resonator components 126c and 126d respectively.

In some cases, all of the potentially risky resonators may be replaced. For example, for the example filter described at 510, each of resonators 106b-106e may be replaced by multi-resonator components.

At 540, the filter can then be manufacturing based on the design determined through steps 510-530. The filter can be manufactured using multi-resonator components in place of potentially risky single resonators.

A signal input terminal and signal output terminal can be provided. The signal input terminal and signal output terminal may correspond to, and may even be identical to, those used in the existing resonator filter.

An input resonator component can be coupled to the signal input terminal. The input resonator component can be provided as an individual resonator.

An output resonator component can be coupled to the signal output terminal. The output resonator component can be provided as an individual resonator.

At least one intermediate resonator component can be coupled between the input resonator component and the output resonator component. The input resonator component, at least one intermediate resonator component, and the output resonator component can all be coupled to define a signal path between the signal input terminal and the signal output terminal.

The at least one intermediate resonator component can include an intermediate resonator component that corresponds to each of the individual resonators of the existing resonator filter. Each intermediate resonator component may have the same resonant frequency as the corresponding individual resonator in the existing resonator filter.

The intermediate resonator component(s) can include a multiple resonator component that corresponds to each of the potentially risky resonators identified. Each multiple resonator component can include two or more individual resonators coupled in parallel. Each individual resonator in a given multiple resonator component can have the same resonant frequency.

In some cases, the input resonator component, output resonator component and at least one intermediate resonator component can be manufactured as a filter structure prior to coupling to the signal input terminal and/or signal output terminal. For example, the input resonator component, output resonator component and at least one intermediate resonator component may be provided as a waveguide filter.

Embodiments described herein may provide multi-resonator filters that have reduced thermal loading and/or improved multipaction thresholds. Individual intermediate resonators in multi-resonator filters may be replaced by multiple resonator components having two or more individual resonators in parallel. In particular, filters configured to operate at high power may have resonators that are likely to receive high power levels replaced by multiple resonator components.

Embodiments of the multi-resonator filters described herein may provide bandpass filters for signals in the microwave spectrum. For example, embodiments of the filters described herein may be defined with resonant frequencies configured to operate in the $K_a$ band (~25 GHz-40 GHz). For example, multi-resonator filters using multiple resonator components as described herein may be configured to provide $K_a$-band output multiplexers, triplexers and diplexers.

In some embodiments described herein, the multi-resonator filters may be configured to provide resonant waveguide structures. In other cases, stripline or coaxial line configurations may be used.

As used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

While the above description describes features of example embodiments, it will be appreciated that some features and/or functions of the described embodiments are susceptible to modification without departing from the spirit and principles of operation of the described embodiments. For example, the various characteristics which are described by means of the represented embodiments or examples may be selectively combined with each other. Accordingly, what has been described above is intended to be illustrative of the claimed concept and non-limiting. It will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

The invention claimed is:

1. A multi-resonator filter comprising:
   a) a signal input terminal;
   b) a signal output terminal; and
   c) a plurality of resonator components comprising an input resonator component coupled to the signal input terminal, an output resonator component coupled to the signal output terminal, and at least one intermediate resonator component coupled between the input resonator component and the output resonator component;
   wherein
      the input resonator component, output resonator component and the at least one intermediate resonator component are arranged in a sequence to define a signal path between the signal input terminal and the signal output terminal;
      the at least one intermediate resonator component comprises at least one multiple resonator component, each multiple resonator component including a pair of individual resonators coupled in parallel wherein each individual resonator in a given pair of individual resonators has the same resonant frequency; and
      each of the input resonator component, the output resonator component and the at least one intermediate resonator component comprises a resonant wave-guiding structure configured to transmit electromagnetic signals.

2. The multi-resonator filter of claim 1, wherein
a) the at least one intermediate resonator component comprises a first intermediate resonator component, a second intermediate resonator component and a third intermediate resonator component coupled in sequence from the first intermediate resonator component to the second intermediate resonator component to the third intermediate resonator component; and
b) the second intermediate resonator component is one of the at least one multiple resonator components.

3. The multi-resonator filed of claim 1, wherein
a) the at least one intermediate resonator component comprises a first intermediate resonator component and a second intermediate resonator component coupled in sequence from the first intermediate resonator component to the second intermediate resonator component;
b) the first intermediate resonator component is one of the multiple resonator components; and
c) the input resonator component is cross-coupled with the second intermediate resonator component.

4. The multi-resonator filter of claim 1, wherein
a) the at least one intermediate resonator component comprises a first intermediate resonator component and a second intermediate resonator component coupled in sequence, wherein each of the first intermediate resonator component and the second intermediate resonator component are multiple resonator components.

5. The multi-resonator filter of claim 1, wherein a specific multiple resonator component in the at least one multiple resonator component further comprises at least one additional individual resonator coupled in parallel with both of the individual resonators in the pair of individual resonators, and each additional individual resonator has the same resonant frequency as the individual resonators in the pair of individual resonators.

6. The multi-resonator filter of claim 1, wherein the signal input is operable to receive signals having a signal power peak of greater than 5 kW.

7. The multi-resonator filter of claim 1, wherein the resonant frequency of each multiple resonator component is in a frequency range between 300 MHz and 300 GHz.

8. The multi-resonator filter of claim 7, wherein the frequency range is between 25 GHz and 40 GHz.

9. The multi-resonator filter of claim 1, wherein the plurality of resonator components define a signal bandpass response for the multi-resonator filter.

10. A method of manufacturing a multi-resonator filter having a multi-resonator bandpass response that corresponds to a series resonator bandpass response of an existing resonator filter having a plurality of individual resonators coupled in series between a signal input and a signal output, the method comprising:
a) identifying at least one of the individual resonators in the plurality of individual resonators as a potentially risky resonator when the at least one individual resonator satisfies a filter risk criteria; and
b) providing a multi-resonator signal input terminal;
c) providing a multi-resonator signal output terminal;
d) coupling an input resonator component to the signal input terminal;
e) coupling an output resonator component to the signal output terminal; and
f) coupling at least one intermediate resonator component between the input resonator component and the output resonator component to define a signal path between the signal input terminal and the signal output terminal, the at least one intermediate resonator comprising a given intermediate resonator component corresponding to each of the individual resonators of the existing resonator filter;
wherein the given intermediate resonator component corresponding to each potentially risky resonator comprises a multiple resonator component, each multiple resonator component including a pair of individual resonators coupled in parallel with each individual resonator in a given pair of individual resonators has the same resonant frequency; and
each of the input resonator component, the output resonator component and the at least one intermediate resonator component comprises a resonant wave-guiding structure configured to transmit electromagnetic signals.

11. The method of claim 10, wherein:
a) the at least one intermediate resonator component comprises a first intermediate resonator component, a second intermediate resonator component and a third intermediate resonator component;
b) the second intermediate resonator component is one of the multiple resonator components; and
c) coupling the at least one intermediate resonator component between the input resonator component and the output resonator component comprises coupling the first intermediate resonator component, second intermediate resonator component, and third intermediate resonator component in sequence from the first intermediate resonator component to the second intermediate resonator component to the third intermediate resonator component.

12. The method of claim 10, wherein
a) the at least one intermediate resonator component comprises a first intermediate resonator component and a second intermediate resonator component coupled in sequence from the first intermediate resonator component to the second intermediate resonator component;
b) the first intermediate resonator component is one of the multiple resonator components; and
c) coupling the at least one intermediate resonator component between the input resonator component and the output resonator component further comprises cross-coupling the input resonator component with the second intermediate resonator component.

13. The method of claim 11, wherein coupling the at least one intermediate resonator component between the input resonator component and the output resonator component comprises coupling a first multiple resonator component and a second multiple resonator component coupled in sequence.

14. The method of claim 11, wherein one of the multiple resonator components comprises at least one additional individual resonator coupled in parallel with both of the individual resonators in the pair of individual resonators, and each additional individual resonator has the same resonant frequency as the individual resonators in the pair of individual resonators.

15. The method of claim 11, further comprising configuring the signal input terminal to receive signals having a signal power peak of greater than 5 kW.

16. The method of claim 11, further comprising defining the resonant frequency of each multiple resonator component in a frequency range between 300 MHz and 300 GHz.

17. The method of claim 16, wherein the frequency range is between 25 GHz and 40 GHz.

18. A multi-resonator filter comprising:
a) a signal input terminal;
b) a signal output terminal; and
c) a plurality of resonator components comprising an input resonator component coupled to the signal input terminal, an output resonator component coupled to the signal output terminal, and at least one intermediate resonator component coupled between the input resonator component and the output resonator component; wherein the input resonator component, output resonator component and the at least one intermediate resonator component are arranged in a sequence to define a signal path between the signal input terminal and the signal output terminal;

the at least one intermediate resonator component comprises at least one multiple resonator component, each multiple resonator component including a pair of individual resonators coupled in parallel wherein each individual resonator in a given pair of individual resonators has the same resonant frequency;

the at least one intermediate resonator component comprises a first intermediate resonator component and a second intermediate resonator component coupled in sequence from the first intermediate resonator component to the second intermediate resonator component;

the first intermediate resonator component is one of the multiple resonator components; and the input resonator component is cross-coupled with the second intermediate resonator component.

19. The multi-resonator filter of claim 18, wherein a specific multiple resonator component in the at least one multiple resonator component further comprises at least one additional individual resonator coupled in parallel with both of the individual resonators in the pair of individual resonators, and each additional individual resonator has the same resonant frequency as the individual resonators in the pair of individual resonators.

20. The multi-resonator filter of claim 18, wherein the resonant frequency of each multiple resonator component is in a frequency range between 300 MHz and 300 GHz.

* * * * *

UNITED STATES PATENT AND TRADEMARK OFFICE
CERTIFICATE OF CORRECTION

PATENT NO. : 11,211,676 B2
APPLICATION NO. : 16/597481
DATED : December 28, 2021
INVENTOR(S) : Zhifu Zhou and Ming Yu It is certified that error appears in the above-identified patent and that said Letters Patent is hereby corrected as shown below:

In the Claims

Claim 3, Column 17, Line 14: the term: "multi-resonator filed" should read "multi-resonator filter"

Signed and Sealed this
Twenty-eighth Day of March, 2023

Katherine Kelly Vidal
*Director of the United States Patent and Trademark Office*